(12) United States Patent
Oleson et al.

(10) Patent No.: US 9,706,655 B2
(45) Date of Patent: Jul. 11, 2017

(54) PACKAGING FOR HIGH POWER INTEGRATED CIRCUITS AND INFRARED EMITTER ARRAYS

(71) Applicant: OLESON CONVERGENT SOLUTIONS, LLC, Santa Barbara, CA (US)

(72) Inventors: Jim Oleson, Santa Barbara, CA (US); Roger Holcombe, Santa Barbara, CA (US)

(73) Assignee: OLESON CONVERGENT SOLUTIONS LLC, Santa Barbara, CA (US)

(*) Notice: Subject to any disclaimer, the term of this patent is extended or adjusted under 35 U.S.C. 154(b) by 0 days.

(21) Appl. No.: 14/327,307

(22) Filed: Jul. 9, 2014

(65) Prior Publication Data
US 2015/0014554 A1    Jan. 15, 2015

Related U.S. Application Data

(60) Provisional application No. 61/844,246, filed on Jul. 9, 2013.

(51) Int. Cl.
*H01L 23/34* (2006.01)
*H05K 1/11* (2006.01)
(Continued)

(52) U.S. Cl.
CPC ............ H05K 1/113 (2013.01); H01L 23/473 (2013.01); *H01L 23/12* (2013.01); *H01L 24/05* (2013.01); *H01L 24/13* (2013.01); *H01L 24/16* (2013.01); *H01L 24/29* (2013.01); *H01L 24/32* (2013.01); *H01L 24/81* (2013.01); *H01L 25/072* (2013.01); *H01L 2224/0401* (2013.01); *H01L 2224/0557* (2013.01); *H01L 2224/05568* (2013.01); *H01L 2224/131* (2013.01); *H01L 2224/16225* (2013.01); *H01L 2224/2919* (2013.01); *H01L 2224/32225* (2013.01); *H01L 2224/81193* (2013.01); *H01L 2924/00014* (2013.01); *H01L 2924/10253* (2013.01); *H01L 2924/10272* (2013.01); *H01L 2924/10329* (2013.01); *H01L 2924/14* (2013.01); *H01L 2924/157* (2013.01)

(58) Field of Classification Search
CPC ........ H01L 31/024; H01L 23/36; H01L 25/65
USPC ....... 257/705, 702, 703, 723, 724, 686, 777, 257/714, 718, 719, 726, 727
See application file for complete search history.

(56) References Cited

U.S. PATENT DOCUMENTS 6,452,798 B1* 9/2002 Smith .................. H01L 23/345 165/80.4
7,579,694 B2* 8/2009 Jan ......................... H01L 24/11 257/778

(Continued)

*Primary Examiner* — S. V. Clark
(74) *Attorney, Agent, or Firm* — Kutak Rock LLP; Neil L. Arney

(57) ABSTRACT

A product and method for packaging high power integrated circuits or infrared emitter arrays for operation through a wide range of temperatures, including cryogenic operation. The present invention addresses key limitations with the prior art, by providing temperature control through direct thermal conduction or active fluid flow and avoiding thermally induced stress on the integrated circuits or emitter arrays. The present invention allows for scaling of emitter arrays up to extremely large formats, which is not viable under the prior art.

34 Claims, 8 Drawing Sheets

(51) Int. Cl.
*H01L 23/473* (2006.01)
*H01L 23/12* (2006.01)
*H01L 23/00* (2006.01)
*H01L 25/07* (2006.01)

(56) References Cited

U.S. PATENT DOCUMENTS

| | | | | |
|---|---|---|---|---|
| 7,977,821 B2 * | 7/2011 | Kojori | ............... | H01L 23/48 307/112 |
| 2005/0205989 A1 * | 9/2005 | Shibuya | ............... | C09K 5/14 257/712 |
| 2006/0185836 A1 * | 8/2006 | Garner | ............... | H01L 23/36 165/185 |

* cited by examiner

PACKAGING FOR HIGH POWER INTEGRATED CIRCUITS AND INFRARED EMITTER ARRAYS

CROSS-REFERENCE TO RELATED APPLICATIONS

This application claims priority pursuant to 35 U.S.C. 119(e) to U.S. Provisional Patent Application, Ser. No. 61/844,246, filed Jul. 9, 2013, the entire disclosure of which is incorporated herein by reference.

FIELD OF THE INVENTION

The present invention relates to a product and method for packaging high power integrated circuits and infrared emitter arrays for use in wide temperature ranges, including cryogenic operation. The present invention addresses key issues existing with current technology, including: temperature control and thermally induced stress for integrated circuits and emitter arrays and allows for scaling of emitter arrays up to extremely large formats.

BACKGROUND OF THE INVENTION

An industry wide problem exists with scaling of infrared emitter arrays up to extremely large formats. Single silicon chip arrays beyond 1024×1024 pixels fail to yield, thus creating a producibility problem and effectively limiting the size of single-chip emitter arrays. The need for larger arrays goes unmet due to this physical size restriction and is aggravated by thermal constraints of existing packaging architectures. Creating a multi-chip emitter array can avoid the single chip producibility problem. Multi-chip emitter arrays, however, introduce other problems, including the need for individual "subarrays" to be precisely aligned on the package and be maintained in a stress-free alignment through a wide temperature range. The package, therefore, has become the limiting factor in emitter array size, particularly when operating at cryogenic temperatures.

In addition, because infrared emitter arrays are high power silicon devices, extending the array size creates a further problem of packaging the emitter array for operation away from the assembly temperature. Silicon's Coefficient of Thermal Expansion (CTE) is substantially different than most packaging materials. Therefore, emitter arrays for use at extreme temperatures, such as cryogenic environments, can suffer catastrophic stress failure when packaged using historical materials such as ceramics, copper and epoxies. Maintaining chip temperature at high power levels also is quite difficult because of the number of thermal interfaces created through the use of stress limiting features.

The historic limitations of chip yield and thermal stress serve as a roadblock to producing very large format high power emitter arrays or integrated circuits to be operated both at room and cryogenic temperatures.

The present invention overcomes the limitations on package size for emitter arrays and integrated circuits by using new materials and assembly techniques to facilitate splitting the emitter array into several precisely aligned subarrays and preserving stress-free alignment and thermal conductivity at all required temperatures. The present invention provides the thermal, electrical, and mechanical interfaces, while allowing for precise mechanical alignment and then preserving that alignment over a wide range of temperatures. The present invention also allows the size of infrared emitter arrays to be expanded to sizes demanded by current and future markets.

SUMMARY OF INVENTION

The following summary of the invention is provided to facilitate an understanding of some of the innovative features unique to the present invention. The present invention is not intended to be limited by this summary.

The present invention relates to packaging for a plurality of high power emitter arrays and/or integrated circuits, where such packaging provides stress management, temperature control, and alignment for the emitter arrays and integrated circuits. By reducing stress, controlling temperatures, and managing alignment of emitter arrays and integrated circuits, the present invention allows the size of infrared emitter arrays to be expanded in size up to 19.66× 19.66 cm (4096×4096 pixels at a 48 micron pitch) and beyond.

The methods for controlling temperatures employed by the present invention include either direct conduction, active fluid flow, or a combination of the two. When direct conduction is used, the heat generated by the integrated circuit or emitter array is conducted through the chip into the package via a solder or other thermally conductive interface. The interface is compliant so that it may expand and contract with temperature in accordance with the integrated circuit and package. When active fluid flow is used to control temperatures, coolant fluid flows through an internal cavity of the package. Heat transfer from the package to the fluid takes place and is facilitated by a conductive material such as a foam or mesh layer within said internal cavity. The conductive material within the cavity is bonded to the walls of the cavity. In one embodiment the conductive material within the internal cavity is made from the same material as the body of the package to allow the package and conductive material within the internal cavity to expand and contract with temperature in a highly synchronous and stress free manner. When used together, conduction and active fluid flow increases heat transfer from the integrated circuit.

The preferred material for the body of the package in the present invention is Carbon Silicon Carbide (C—SiC). However, formulations of Silicon Carbide (SiC) also may be used. C—SiC is the preferred material because it has a CTE near 2.6 microns/Meter ° Kelvin and a thermal conductivity near 150 Watts/Meter Kelvin, which are compatible with silicon integrated circuits and emitter arrays. For higher CTE applications (such as with Gallium Arsenide integrated circuits), the preferred package material is SiC.

In packages where active fluid flow is used to advance heat transfer, the preferred conductive material used in the internal cavity is C—SiC foam, which is precisely machined or fabricated to fill the internal cavity to enhance direct conduction of heat away from the integrated circuit to the cooling liquid. In some embodiments, the conductive material used in the internal cavity is copper or other metal mesh. The conductive material used to fill the internal cavity is bonded to the walls of the internal cavity using a thermally compatible epoxy, a siliconization reflow process, or by reflowing a metal solder or braze material.

In embodiments of the present invention using active fluid flow, the preferred method for forming the internal cavity is to machine or fabricate a body with an opening to one side and a lid to enclose the opening to the internal cavity. During the assembly process, the body and lid are bonded together using epoxy, solder, braze or other bonding medium. Other methods for fabricating a package with an internal cavity also may be used.

In the preferred embodiment of the present invention, the top, external surface of the package is flat for direct bonding of the integrated circuit or emitter array without the need for a ceramic or other type of chip carrier. To further enhance heat transfer away from the integrated circuit or emitter arrays, in the preferred embodiment of the present invention, the top, external surface of the package is metallized for direct interfacing to the integrated circuit or emitter arrays, using techniques such as bump bonding. In an alternative embodiment, the top, external surface of the package accepts an integrated circuit or emitter array mounted in a chip carrier, which is then bonded to the top surface.

The package of the present invention includes a method for precision alignment of the infrared emitter array or integrated circuit. Precision alignment may be achieved by using precisely placed reference pins in the top surface of the package. The pins provide mechanical stops against which the integrated circuit or emitter array rests. An alternative approach is to machine precisely toleranced grooves into the top surface of the package to provide mechanical stops for placing the integrated circuit or emitter array. SiC and C—SiC can be machined to extremely fine tolerances, making packages of the present invention ideal for the use of accurately placed mechanical features. A further approach is to bond the emitter array onto the package, using precision alignment tooling and reference datums on the emitter array and package. In this approach the emitter array is aligned over the package using the precision alignment tooling, is brought into contact with the flat top surface of the package, and then is bonded to the package using a solder or epoxy. Other methods known in the art also may be used to achieve precision alignment.

The preferred embodiment of the present invention includes a plurality of feedthrus for the coolant fluid with the feedthrus bolted together from within to provide compressive load on the package. The preferred material for the feedthru is Invar. The seal between each feedthru and package is provided by a rubber O-rings, such as Viton. For cryogenic applications, a metal seal is preferred.

The preferred embodiment has a plurality of inserts installed in the package body for accepting fasteners for interfacing with peripheral components such as optical apertures and windows, close proximity circuit cards, temperature sensors, or even cooling straps. The inserts provide threaded stress-free interfaces between the C—SiC or SiC package and the fasteners themselves.

The preferred embodiment has a plurality of thru-holes for mounting bolts, which allow the package with the integrated circuits or emitter arrays to be mounted onto other surfaces such as cooling straps or rails. The thru-hole and mounting bolts allow for tight bonding of the package without creating any tensile or shearing stress on the package.

DESCRIPTION OF DRAWINGS

The accompanying figures are incorporated herein and form a part of the specification for the present invention and further illustrate the present invention.

DETAILED DESCRIPTION OF INVENTION

Figure 1:
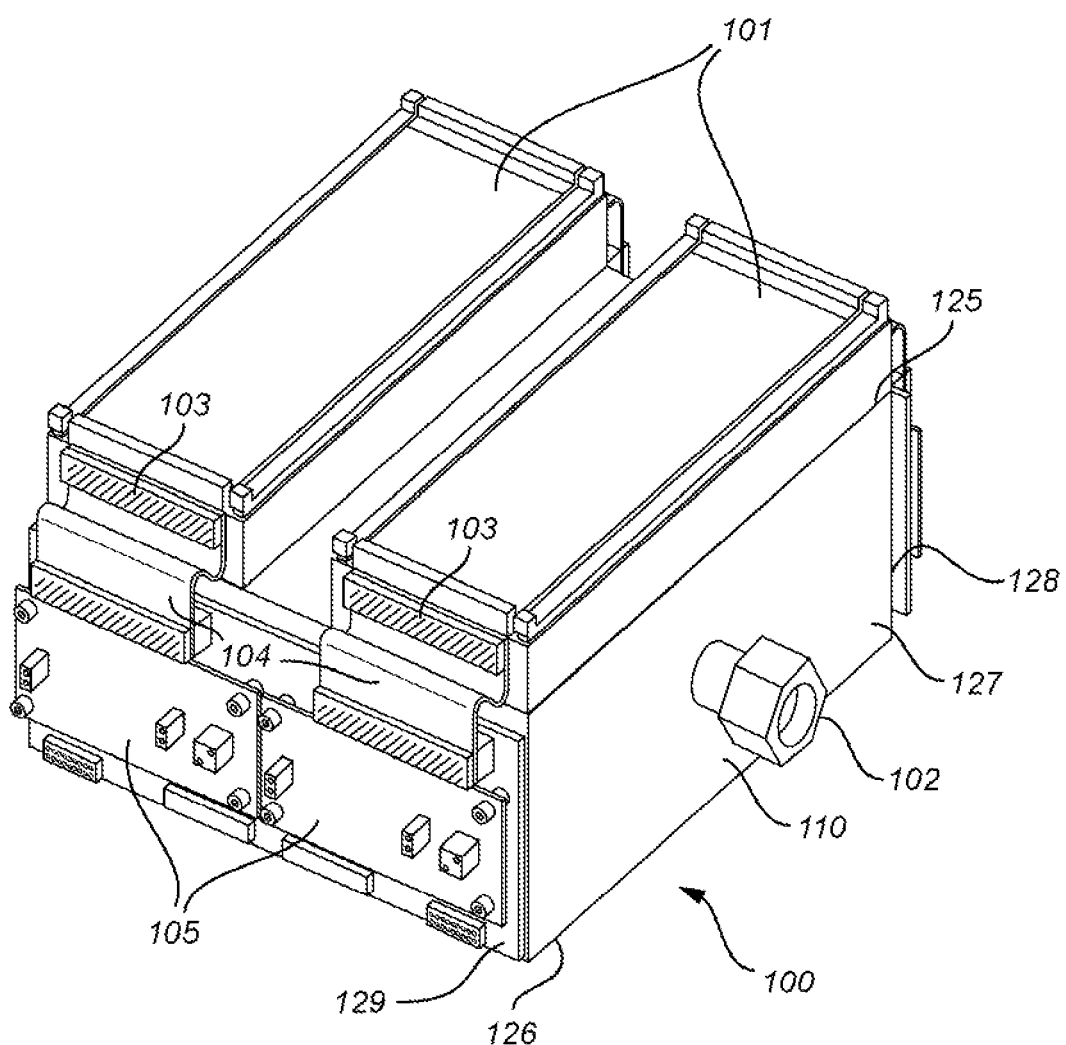
FIG. 1 is a perspective view of one embodiment of two high power integrated circuits mounted on the thermally conductive, stress free package of the present invention. The package of FIG. 1 utilizes both direct conduction and active fluid flow.

FIG. 1 shows an embodiment of the package 100 of the present invention with two pairs of precision edge butted and aligned high power integrated circuits 101 mounted on the top surface 125 of the package 100. In the preferred embodiment of the present invention, the body 110 of the package 100 is made from C—SiC. C—SiC is the preferred material for the body 110 because it has a CTE near 2.6 microns/Meter ° Kelvin and a thermal conductivity near 150 Watts/Meter Kelvin, which are compatible with silicon integrated circuits and emitter arrays. Other materials with similar CTE and thermal conductivity, such as some formations of SiC, may be used for the package. For higher CTE applications (such as with Gallium Arsenide integrated circuits), the preferred package 100 material is SiC.

The top surface 125 of the package 100 is machined or otherwise fabricated to be flat allowing for precise bonding and alignment of integrated circuits 101 onto the top surface 125 of the package 100. In alternative embodiments, a chip carrier containing one or more integrated circuits or emitter arrays is then bonded to the flat top surface 125 of the package 100. The integrated circuits 101 or chip carriers may be bonded to the package 100 using epoxy, solder or a braze material.

Figure 3:
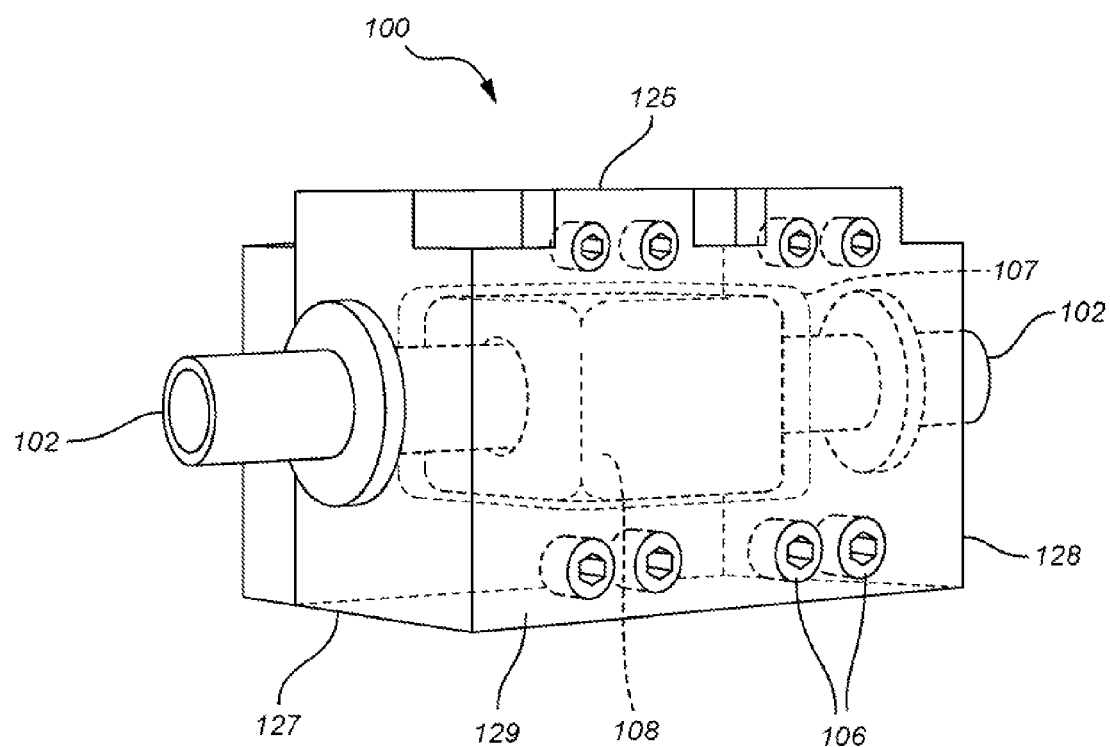
FIG. 3 is transparent, side view of one embodiment of the thermally conductive, stress free package of the present invention for use in mounting high power emitter arrays or integrated circuits. The package of FIG. 3 utilizes both direct conduction and active fluid flow.
Figure 4:
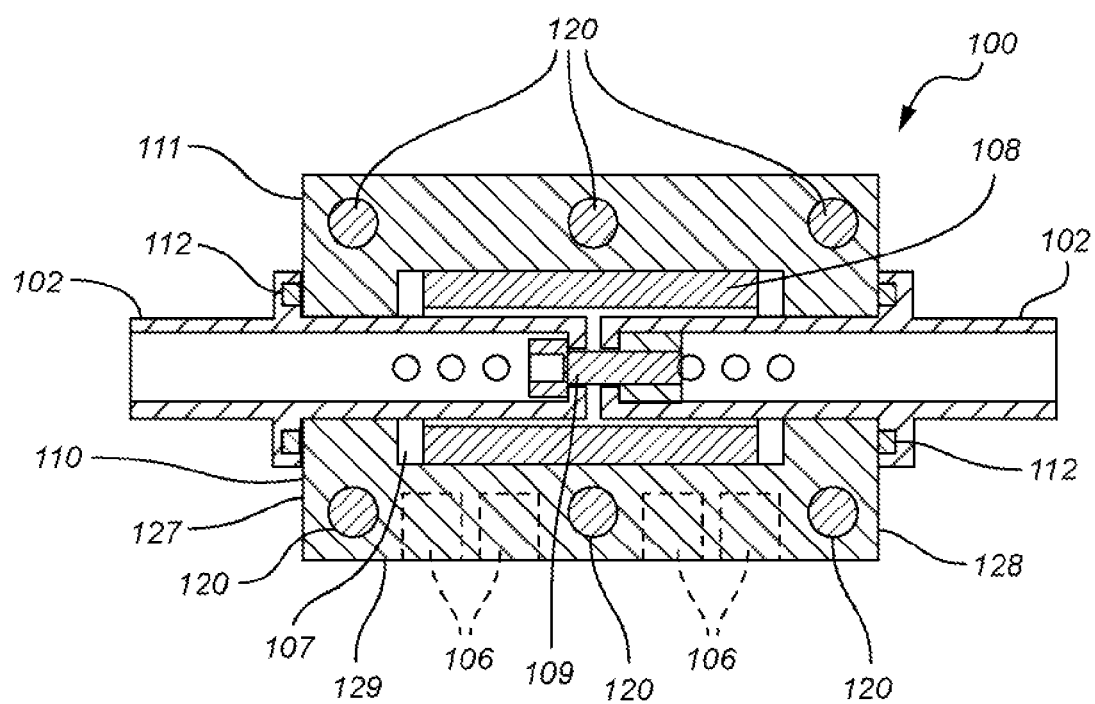
FIG. 4 is a cross-sectional, bottom view of one embodiment of the thermally conductive, stress free package of the present invention for use in mounting high power emitter arrays or integrated circuits. The package of FIG. 4 utilizes both direct conduction and active fluid flow.
Figure 5:
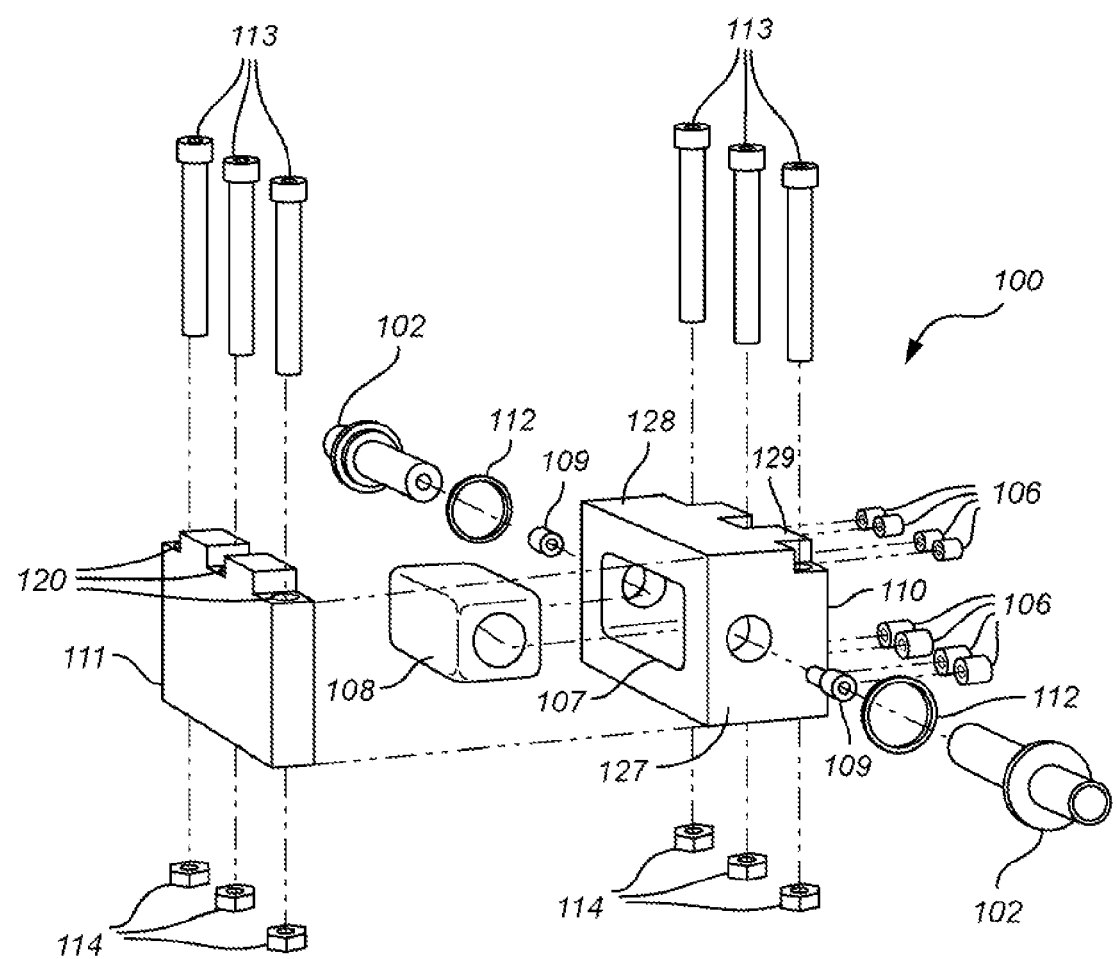
FIG. 5 is an exploded view of one embodiment of the thermally conductive, stress free package of the present invention for use in mounting high power emitter arrays or integrated circuits. The package of FIG. 5 utilizes both direct conduction and active fluid flow.

The package 100 as shown in FIG. 1 has a top surface 125, a bottom surface 126, and a plurality of sides 127, 128, 129. The package 100 includes a body 110 with an internal cavity 107 (as shown in FIGS. 3-5) and coolant feedthrus 102, which allow liquid coolant to flow through the internal cavity 107 of the package 100 for active fluid flow heat transfer. FIG. 1 shows one of a plurality of coolant feedthrus 102. FIG. 1 also shows circuit cards 105 attached to one side 129 of the package. The circuit cards are attached using fastener inserts 106 (as shown in FIGS. 2-3) on one side of the package 100, electrical interfaces 103 for connecting the integrated circuits 101 to the circuit cards 105, and interface cables 104 for making the connection between the integrated circuits 101 and the circuit cards 105.

Figure 2:
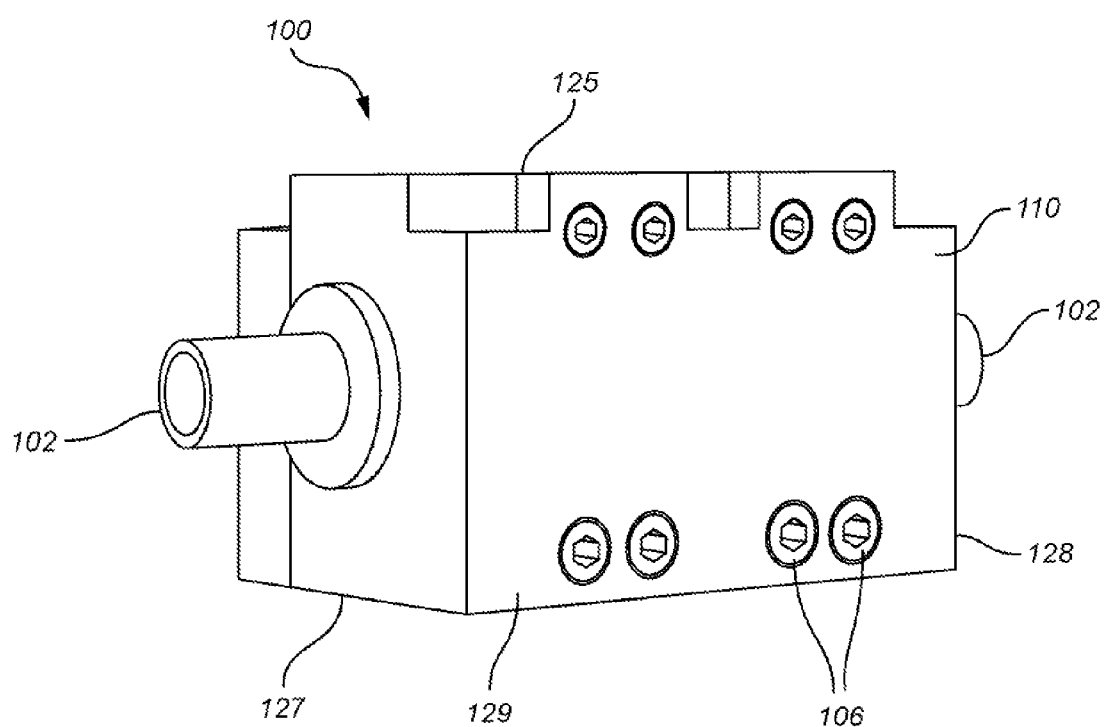
FIG. 2 is a perspective, side view of one embodiment of the thermally conductive, stress free package of the present invention for use in mounting high power emitter arrays or integrated circuits. The package of FIG. 2 utilizes both direct conduction and active fluid flow.

FIG. 2 shows an embodiment of the package 100 of the present invention utilizing both active fluid flow and direct conduction. FIG. 2 is a side view of the package 100, showing two coolant feedthrus 102, extending from one side 127 through the internal cavity 107 (shown in FIGS. 3-6) to another side 128 of the package 100. In the preferred embodiment, the feedthrus 102 are a hard, low thermal expansion metal that readily accepts clamps and other fluid interface fittings, such as Invar or other low CTE material. The feedthrus 102 also are thermally matched to the body 110 of the package 100 by using materials with similar CTE to the package 100. FIG. 2 also shows a plurality of fastener inserts 106 on a side 129 of the package 100, which allow for mounting of peripheral electronics and hardware, such as the circuit cards shown in FIG. 1, optical apertures and windows, temperature sensors, or cooling straps. The fastener inserts 106 provide threaded stress-free interfaces between the C—SiC or SiC package 100 and the fasteners 106 themselves.

FIG. 3 shows an embodiment of the package 100 of the present invention utilizing both active fluid flow and direct conduction. FIG. 3 is a transparent, side view of the package 100 in a preferred embodiment. FIG. 3 shows the coolant feedthrus 102 extending from one side 127 through the internal cavity 107 of the package 100 and the conductive material 108 to another side 128. FIG. 3 also shows the internal cavity 107 of the package 100 and the conductive material 108 used within the internal cavity 107. The use of conductive material 108, such as C—SiC foam, within the internal cavity 107 efficiently provides direct conduction and improves heat transfer from the high power integrated circuit 101 to the liquid coolant flowing through the feedthrus 102. When C—SiC foam is used as the conductive material 108 in the internal cavity 107, it is fabricated to fit precisely within the internal cavity 107. The C—SiC foam is bonded to the walls of the internal cavity 107 using a thermally compatible epoxy, a siliconization reflow process, or by reflowing a metal solder or braze material. The C—SiC foam is bonded to the walls of the internal cavity 107 so that the foam is in intimate thermal contact with the walls of the internal cavity 107 for improved direct heat conduction. The C—SiC foam also acts as a passive thermal conductor when no liquid coolant is flowing through the package 100 by effectively increasing the cross-sectional area of the package 107 through which heat is transferred. When there is active fluid flow, the C—SiC foam acts as a thermal transfer medium facilitating heat flow between the package 100 and liquid coolant.

In alternative embodiments, copper or other metal mesh may be used as the conductive material 108 in the internal cavity 107. Metal mesh is preferable when superior thermal conductivity (greater than 150 Watts $m^{-1}$ $K^{-1}$) through the internal cavity 107 is desired or when the internal geometry of the package cavity makes using SiC or C—SiC foam difficult to machine to adequate tolerances. Metal mesh, when used as the conductive material 108 in the internal cavity 107, also is bonded to the walls of the internal cavity 107 using a thermally compatible bonding agent, such as solder or braze material.

FIG. 4 is a cross-sectional, bottom view of the package 100 of the present invention utilizing both active fluid flow and direct conduction. FIG. 4 shows the coolant feedthrus 102 passing through the internal cavity 107 of the package 100 and the conductive material 108 and extending from one side 127 to another side 128 of the package 100. The feedthrus 102 are connected using a nut-bolt interface 109. The feedthrus 102 are sealed against the sides of the body 110 of the package 100 using seals 112, such as rubber O-rings, or metal c-rings or c-seals, to prevent cooling fluid from leaking out of the internal cavity 107. The connection of the feedthrus 102 using the nut-bolt interface 109 creates a compressive force on the sides 127, 128 of the package 100. The compressive force helps minimize tensile and shearing stress on the integrated circuit 101 and package 100, and helps avoid stress failures, caused by extreme temperature cycling. The compressive force on the seals 112 also creates a hermetic seal between the internal cavity 107 and the outside environment, preventing the coolant from contacting the integrated circuits, other peripheral electronics, or degrading a surrounding vacuum environment. The liquid coolant is provided from an outside source and enters the internal cavity 107 of the package 100 through one of the feedthrus 102 and exits the package 100 through the other feedthru 102. The flow of coolant through the internal cavity 107 provides heat transfer from the integrated circuit using active fluid flow.

Figure 6:
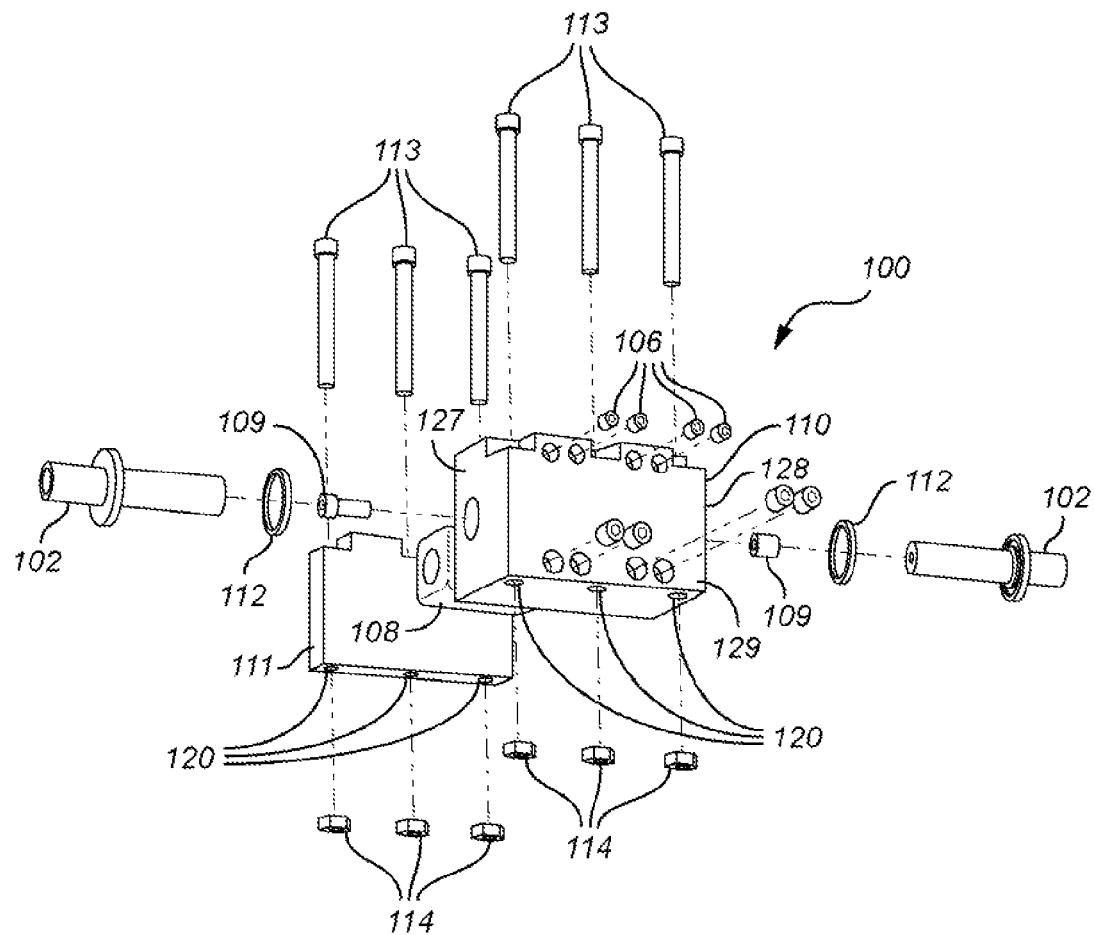
FIG. 6 is an exploded view of one embodiment of the thermally conductive, stress free package of the present invention for use in mounting high power emitter arrays or integrated circuits. The package of FIG. 6 utilizes both direct conduction and active fluid flow.

FIGS. 5 and 6 are exploded views of the package 100 of the present invention utilizing both active fluid flow and direct conduction. In these embodiments, the package 100 includes a body 110 and a side lid 111. The body 110 and lid 111 also are shown in FIG. 4. The body 110 is machined or otherwise fabricated to form the internal cavity 107 with a side opening. The lid 111 is machined or otherwise fabricated to cover the side opening of the body 110 to form the internal cavity 107. During the assembly process of this embodiment of the package 100, the lid 111 is bonded to the body 110 using epoxy, solder, braze or other bonding medium. FIGS. 5 and 6 also show the conductive material 108 used in the internal cavity 107, which is machined or otherwise fabricated to fit precisely within the internal cavity 107 to enhance heat transfer.

Both FIGS. 5 and 6 show the feedthrus 102, the nut-bolt interface 109, and the seals 112 for sealing the internal cavity 107 from the outside environment. The embodiment of FIGS. 5 and 6 includes two feedthrus 102 but additional coolant feedthrus 102 may be used depending on the shape or size of the package 100 or the heat transfer requirements. The feedthrus 102 in the preferred embodiment are fabricated from a metal alloy with a low coefficient of thermal expansion, such as Invar, which has a compatible CTE to Silicon and C—SiC. The feedthrus 102 pass through the body 110 and into the internal cavity 107. In this embodiment, the feedthrus 107 are connected using the nut-bolt interface 109. When tightened, the nut-bolt interface 109 causes the feedthrus 107 to exert a compressive force on the sides 127, 128 of the package 100. The seals 112 also are compressed when the nut-bolt interface 109 is tightened. The seals 112 between the feedthrus 102 and package body 110 provide a hermetic interface at all temperatures from cryogenic to above room temperature.

FIGS. 5 and 6 also show a plurality of mounting bolts 113 and nuts 114 for use in mounting the package 100 and the integrated circuits onto thermal straps or rails, or other external surfaces. As shown in FIG. 4, the body 110 and lid 111 contain a plurality of thru-holes 120 for the mounting bolts 113. The thru-holes 120 and the mounting bolts 113 allow for mounting and tight bonding of the package 100 and integrated circuit 101 to a cooling strap or rail without creating any tensile or shearing stress on the package, which could cause failure of the package and integrated circuit at extreme temperatures.

The embodiment of FIGS. 5 and 6 also includes a plurality of fastener inserts 106 on a side 129 of the package 100 for use in mounting peripheral electronics and hardware. In the preferred embodiment, the fastener inserts 106 vary in size, including 4/40, 6/32, 8/32, and 10/24. The fastener inserts may be included on more than one side of the package 100.

Figure 7:
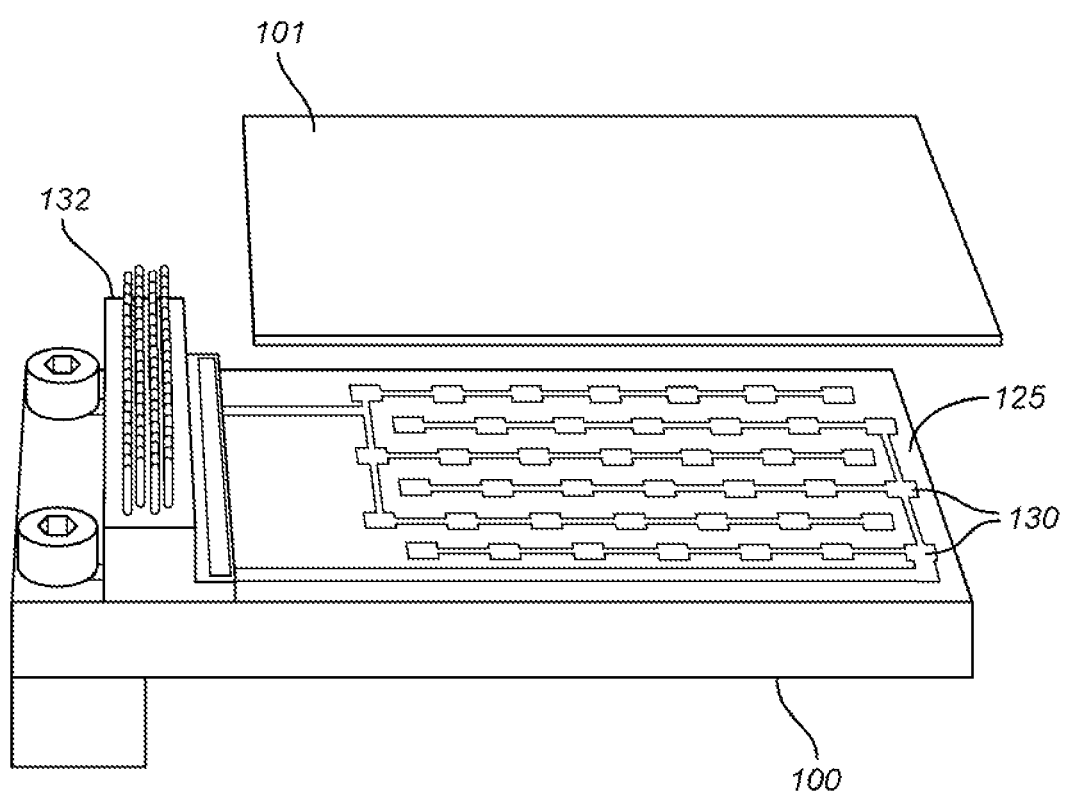
FIG. 7 is a perspective view of a high power emitter arrays or integrated circuit and one embodiment of the thermally conductive, stress free package of the present invention. The package of FIG. 7 utilizes direct conduction.
Figure 8:
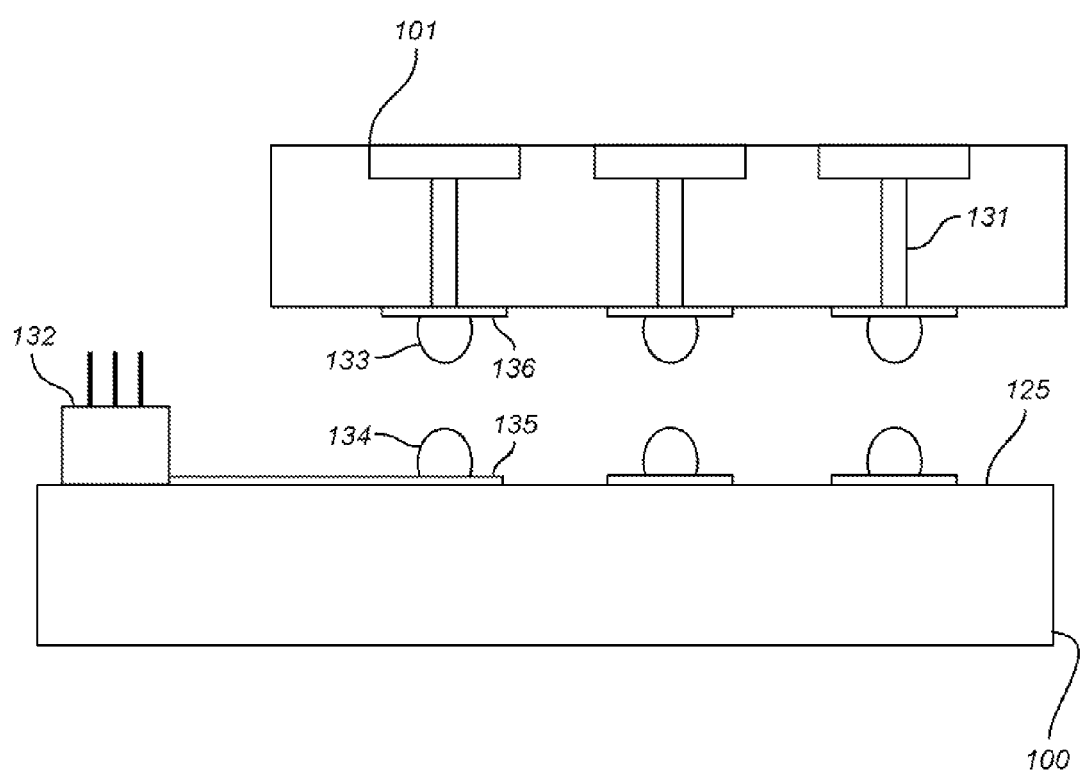
FIG. 8 is an enhanced side view of a high power emitter array or integrated circuit and one embodiment of the thermally conductive, stress free package of the present invention. The package of FIG. 8 utilizes direct conduction.

A further embodiment of the present invention is shown in FIGS. 7 and 8, which is a package 100 that provides heat transfer through direct conduction without active fluid flow. In this embodiment, the package 100 is made from SiC or C—SiC material that is thermally matched to the integrated circuits or emitter arrays. The top surface 125 of the package 100 contains patterns of electrical traces 130 with contact pads 135 and metal bumps 134. The electrical traces 130 are used for Thru Silicon Via 131 interconnection to the high power integrated circuit or emitter array 101. The electrical traces 130 provide electrical routing to the integrated circuit 101 from an attached interconnect board 132. In this embodiment, the package 100 provides direct conduction from the integrated circuit 101 into the package through the interconnections of the electrical traces 130. Further, because the electrical traces 130 are distributed across the interface between the integrated circuit 101 and package 100, thermally induced stress between the integrated circuit 101 and the package 100 is reduced or eliminated.

The package 100 of the present invention allows precision alignment of infrared emitter arrays to be maintained in temperature ranges between cryogenic to above room temperature. Precision alignment is achieved through one of several methods. One method is use of precisely placed reference pins in the wall of the package 100. The pins provide mechanical surfaces against which the integrated circuit 101 or emitter array rests. A second method is to machine precisely toleranced grooves into the package 100 to provide mechanical stops for placing the integrated circuit or emitter array. SiC and C—SiC can be machined to extremely fine tolerances, making such material ideal when accurately placed mechanical features are needed. A further method is to bond the emitter array or integrated circuit onto the package 100, using precision alignment tooling that uses reference datums on the array and package. In this third method the emitter array or integrated circuit is aligned over the package 100, brought into contact with the flat top surface 125 of the package 100, and then bonded to the package 100 using a solder or epoxy or other means.

The package 100 of the present invention eliminates physical stresses that may arise as the silicon integrated circuit and package 100 change temperature. The package 100 of the present invention can vary in shape, can be scaled up or down in size, can be fabricated to accommodate a plurality of integrated circuits or emitter arrays, and can be used for the assembly of large area infrared emitter arrays and other high power integrated circuits, which operate at a wide range of temperatures, including cryogenic temperatures.

What is claimed is:

1. A package for rigidly affixing high power silicon integrated circuits, comprising:
    a body fabricated from a material having a Coefficient of Thermal Expansion (CTE) compatible with the CTE of the silicon integrated circuits;
    the body having a flat top surface for rigidly affixing the silicon integrated circuits, a bottom surface, and a plurality of sides;
    an internal cavity within the body of the package;
    a conductive material fabricated to fit within the internal cavity to advance heat transfer from the silicon integrated circuits;
    a plurality of feedthrus extending from one of the plurality of sides to another of the plurality of sides passing through the internal cavity and the conductive material and thereby allowing coolant to flow from an outside source through the internal cavity of the package; and
    the plurality of feedthrus are connected by a means that exerts a compressive force on the body of the package.

2. A package of claim 1 wherein the body material is Carbon-Silicon Carbide (C—SiC).

3. A package of claim 2 wherein the body material has a CTE of 2.6 microns/Meter ° Kelvin and a thermal conductivity of 150 Watts/Meter Kelvin.

4. A package of claim 1 wherein the conductive material is a C—SiC foam.

5. A package of claim 4 wherein the conductive material is rigidly affixed within the internal cavity using a thermally compatible material.

6. A package of claim 1 wherein the conductive material is a metal mesh.

7. A package of claim 6 wherein the conductive material is rigidly affixed within the internal cavity using a thermally compatible material.

8. A package of claim 1 wherein the feedthrus are a hard, low thermal expansion metal.

9. A package of claim 8 wherein the metal is Invar.

10. A package of claim 1 wherein a seal is installed between the feedthrus and the body of the package to prevent leakage of the coolant from the internal cavity.

11. A package of claim 1 wherein a plurality of fastener inserts are rigidly installed into the sides of the package for attaching peripheral electronics and hardware.

12. A package of claim 1 wherein a plurality of thru-holes are formed in the body of the package, allowing the package to be rigidly affixed to other surfaces.

13. A package for rigidly affixing high power silicon emitter arrays, comprising:
    a body fabricated from a material having a Coefficient of Thermal Expansion (CTE) compatible with the CTE of the silicon integrated circuits;
    the body having a flat top surface for rigidly affixing the silicon emitter arrays, a bottom surface, and a plurality of sides;
    an internal cavity within the body of the package;
    a conductive material fabricated to fit within the internal cavity to advance heat transfer from the silicon integrated circuits;
    a plurality of feedthrus extending from one of the plurality of sides to another of the plurality of sides passing through the internal cavity and the conductive material and thereby allowing coolant to flow from an outside source through the internal cavity of the package; and
    the plurality of feedthrus are connected by a means that exerts a compressive force on the body of the package.

14. A package of claim 13 wherein the body material is Carbon-Silicon Carbide (C—SiC).

15. A package of claim 13 wherein the body material has a CTE of 2.6 microns/Meter ° Kelvin and a thermal conductivity of 150 Watts/Meter Kelvin.

16. A package of claim 13 wherein the conductive material is a C—SiC foam.

17. A package of claim 16 wherein the conductive material is rigidly affixed within the internal cavity using a thermally compatible material.

18. A package of claim 13 wherein the conductive material is a metal mesh.

19. A package of claim 18 wherein the conductive material is rigidly affixed within the internal cavity using a thermally compatible material.

20. A package of claim 13 wherein the feedthrus are a hard, low thermal expansion metal.

21. A package of claim 20 wherein the metal is Invar.

22. A package of claim 13 wherein a seal is installed between the feedthrus and the body of the package to prevent leakage of the coolant from the internal cavity.

23. A package of claim 13 wherein a plurality of fastener inserts are rigidly installed into the sides of the package for attaching peripheral electronics and hardware.

24. A package of claim 13 wherein a plurality of thru-holes are formed in the body of the package, allowing the package to be rigidly affixed to other surfaces.

25. A package of claim 1 wherein the body material is Silicon Carbide (SiC).

26. A package of claim 13 wherein the body material is Silicon Carbide (SiC).

27. A package for rigidly affixing high power silicon emitter arrays, comprising:
  a body fabricated from a material having a Coefficient of Thermal Expansion (CTE) compatible with the CTE of the silicon integrated circuits;
  the body having a flat top surface for rigidly affixing the silicon emitter arrays, a bottom surface, and a plurality of sides;
  an internal cavity within the body of the package;
  a plurality of feedthrus extending from one of the plurality of sides to another of the plurality of sides passing through the internal cavity and thereby allowing coolant to flow from an outside source through the internal cavity of the package; and
  the plurality of feedthrus are connected by a means that exerts a compressive force on the body of the package.

28. A package of claim 27 wherein the body material is one of Si—SiC, C—SiC, or SiC.

29. A package of claim 27 wherein the body material has a CTE of 2.6 microns/Meter ° Kelvin and a thermal conductivity of 150 Watts/Meter Kelvin.

30. A package of claim 27 wherein the feedthrus are a hard, low thermal expansion metal.

31. A package of claim 30 wherein the metal is Invar.

32. A package of claim 27 wherein a seal is installed between the feedthrus and the body of the package to prevent leakage of the coolant from the internal cavity.

33. A package of claim 27 wherein a plurality of fastener inserts are rigidly installed into the sides of the package for attaching peripheral electronics and hardware.

34. A package of claim 27 wherein a plurality of thru-holes are formed in the body of the package, allowing the package to be rigidly affixed to other surfaces.

* * * * *